(12) United States Patent
Choi et al.

(10) Patent No.: US 9,589,842 B2
(45) Date of Patent: Mar. 7, 2017

(54) SEMICONDUCTOR PACKAGE AND METHOD OF FABRICATING THE SAME

(71) Applicant: Samsung Electronics Co., Ltd., Suwon-si, Gyeonggi-do (KR)

(72) Inventors: Inho Choi, Seoul (KR); Donghan Kim, Osan-si (KR); Jae Choon Kim, Incheon (KR); Jikho Song, Seoul (KR); Mitsuo Umemoto, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/993,054

(22) Filed: Jan. 11, 2016

(65) Prior Publication Data

US 2016/0225669 A1    Aug. 4, 2016

(30) Foreign Application Priority Data

Jan. 30, 2015 (KR) .................. 10-2015-0015356

(51) Int. Cl.
*H01L 21/44* (2006.01)
*H01L 23/485* (2006.01)
(Continued)

(52) U.S. Cl.
CPC ............ *H01L 21/78* (2013.01); *H01L 21/561* (2013.01); *H01L 21/768* (2013.01); *H01L 24/19* (2013.01); *H01L 24/20* (2013.01); *H01L 24/96* (2013.01); *H01L 24/97* (2013.01); *H01L 21/565* (2013.01); *H01L 21/568* (2013.01); *H01L 23/3128* (2013.01); *H01L 2224/0401* (2013.01); *H01L 2224/04105* (2013.01); *H01L 2224/12105* (2013.01); *H01L 2224/16227* (2013.01); *H01L 2924/3511* (2013.01)

(58) Field of Classification Search
CPC ... H01L 21/56; H01L 21/565; H01L 21/6835; H01L 21/6836; H01L 21/78; H01L 23/28; H01L 23/3107; H01L 23/3121; H01L 23/3135; H01L 24/29; H01L 24/32; H01L 24/73; H01L 24/83; H01L 24/96; H01L 24/97; H01L 25/0655
See application file for complete search history.

(56) References Cited

U.S. PATENT DOCUMENTS 5,450,283 A * 9/1995 Lin ................ H01L 21/563
174/16.3
5,841,193 A * 11/1998 Eichelberger ...... H01L 23/5389
257/723
(Continued)

FOREIGN PATENT DOCUMENTS

JP    2009188392 A    8/2009
JP    2013251369 A    12/2013
(Continued)

*Primary Examiner* — Pamela E Perkins
(74) *Attorney, Agent, or Firm* — Renaissance IP Law Group LLP

(57) ABSTRACT

A method of fabricating a semiconductor package is disclosed. The method includes disposing semiconductor chips on a support substrate, forming a protection layer covering top surfaces of the semiconductor chips, forming a molding layer covering the support substrate and the protection layer, and etching the molding layer to expose the protection layer.

20 Claims, 9 Drawing Sheets

(51) Int. Cl.
*H01L 21/78* (2006.01)
*H01L 21/56* (2006.01)
*H01L 21/768* (2006.01)
*H01L 23/00* (2006.01)
H01L 23/31 (2006.01)

(56) References Cited

U.S. PATENT DOCUMENTS

| | | | |
|---|---|---|---|
| 6,444,498 B1 * | 9/2002 | Huang | H01L 21/561 |
| | | | 257/706 |
| 6,656,819 B1 | 12/2003 | Sugino et al. | |
| 6,699,731 B2 * | 3/2004 | Huang | H01L 21/561 |
| | | | 257/E21.504 |
| 6,964,881 B2 | 11/2005 | Chua et al. | |
| 7,489,020 B2 | 2/2009 | Benson | |
| 7,534,657 B2 | 5/2009 | Yamaguchi et al. | |
| 8,026,601 B2 | 9/2011 | Cho | |
| 2004/0043533 A1 | 3/2004 | Chua et al. | |
| 2005/0085009 A1 | 4/2005 | Yamaguchi et al. | |
| 2006/0192283 A1 | 8/2006 | Benson | |
| 2008/0237896 A1 | 10/2008 | Cho | |
| 2012/0013006 A1 * | 1/2012 | Chang | H01L 21/561 |
| | | | 257/738 |
| 2014/0084423 A1 | 3/2014 | Priewasser | |

FOREIGN PATENT DOCUMENTS

| | | |
|---|---|---|
| KR | 100831968 B1 | 5/2008 |
| KR | 1020110077485 A | 7/2011 |

* cited by examiner

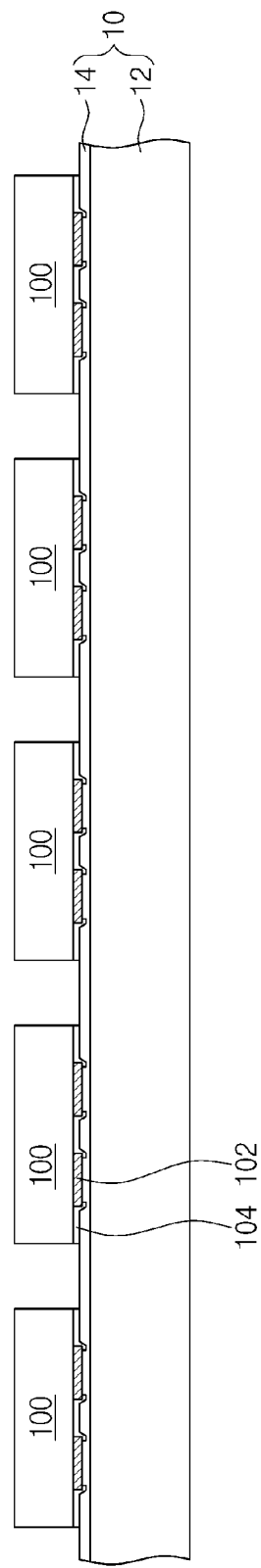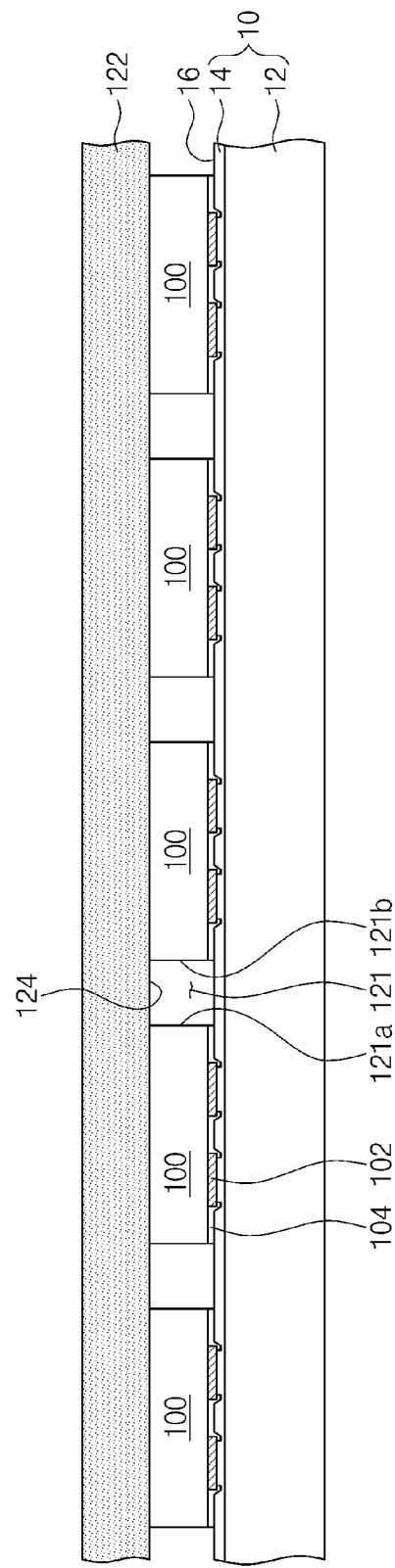

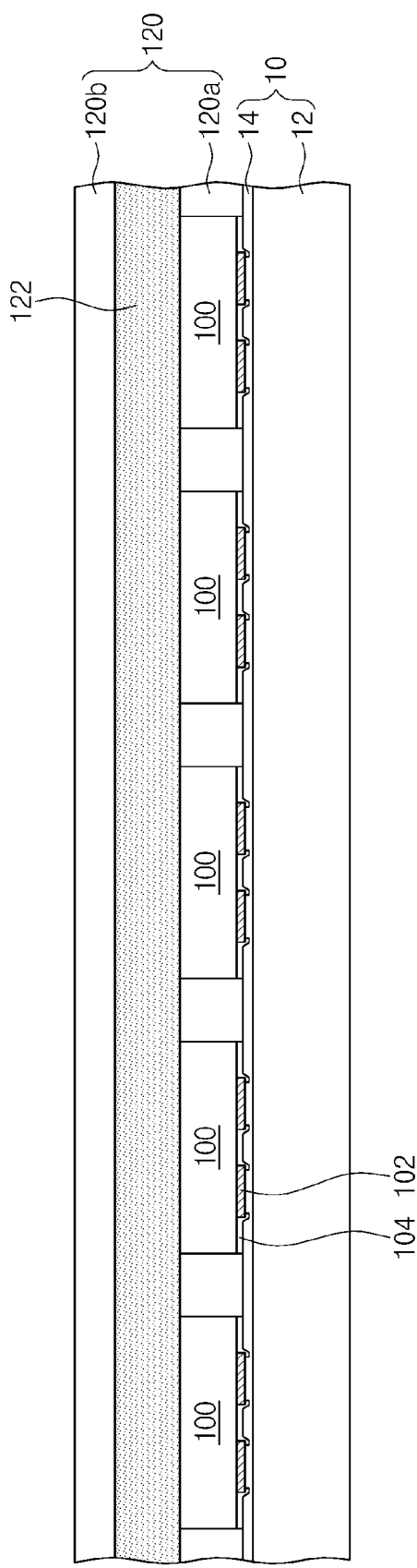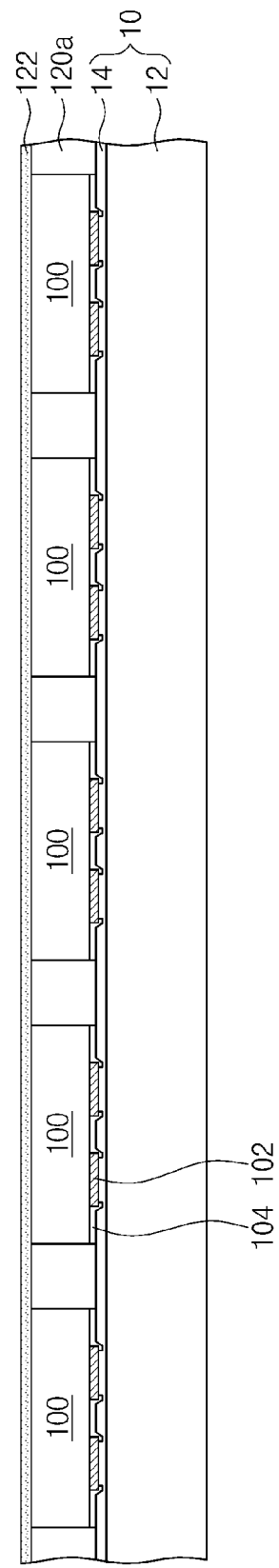

SEMICONDUCTOR PACKAGE AND METHOD OF FABRICATING THE SAME

CROSS-REFERENCE TO RELATED APPLICATION

This U.S. non-provisional patent application claims priority under 35 U.S.C. §119 to Korean Patent Application No. 10-2015-0015356, filed on Jan. 30, 2015, in the Korean Intellectual Property Office, the disclosure of which is hereby incorporated by reference in its entirety.

BACKGROUND

Embodiments disclosed herein relate to a semiconductor package and method of fabricating the same and, more particularly, to a wafer-level package and a method of fabricating the same.

Small, light, and/or low-cost semiconductor packages have been in increasing demand as the electronic industry has developed. In addition, various kinds of semiconductor packages have been developed to be applied to various fields, such as digital image device, a MP3 player, a mobile phone, and a mass-storage device. The various kinds of semiconductor packages may include a ball grid array (BGA) package and a wafer-level package.

A redistribution pattern may be formed on a semiconductor chip without a molding process, and solder balls may be bonded directly to the redistribution pattern, thereby realizing the wafer-level package. In other words, the wafer-level package may not need a molding process and a printed circuit board, so the wafer-level package may be a simple structure and thin.

SUMMARY

A semiconductor package and a method of fabricating the same may be provided to be capable of protecting the semiconductor chip from external damage and thus improving the reliability of the semiconductor package.

According to one aspect, a method of forming a semiconductor package may include providing a plurality of semiconductor chips spaced apart from each other on a support substrate, forming a protection layer covering top surfaces of the plurality of semiconductor chips, forming a molding layer covering the support substrate and the protection layer, and etching the molding layer formed on the protection layer to expose the protection layer.

In an embodiment, first portions of a bottom surface of the protection layer may be in contact with the top surfaces of the semiconductor chips.

In an embodiment, second portions of the bottom surface of the protection layer may not be in contact with the top surfaces of the plurality of semiconductor chips and have a thickness greater than that of the first portions of the protection layer with the bottom surface in contact the top surface of the plurality of the semiconductor chips.

In an embodiment, second portions of a bottom surface of the protection layer may not be in contact with the top surfaces of the plurality of semiconductor chips and may be spaced apart from a top surface of the support substrate.

In an embodiment, forming the protection layer may include forming a space between the semiconductor chips. The space may be defined by sidewalls of adjacent semiconductor chips, a top surface of the support substrate and a bottom surface of the protection layer.

In an embodiment, forming the molding layer may include forming a molding member and a sacrificial member. The molding member may fill the space on the support substrate, and the sacrificial member may be formed on the protection layer.

In an embodiment, etching the molding layer may include substantially completely removing the sacrificial member while leaving the molding member.

In an embodiment, etching the molding layer may include substantially completely removing the sacrificial member, and etching an upper portion of the protection layer.

In an embodiment, the protection layer may be a tape type and may be adhered to the top surfaces of the plurality of semiconductor chips.

In an embodiment, the method may further include separating the support substrate from the plurality of semiconductor chips, forming an insulating layer on bottom surfaces of the plurality of semiconductor chips, forming a plurality of interconnections in the insulating layer, each interconnection electrically connected to corresponding one of the plurality of the semiconductor chips, forming a plurality of terminal pads on corresponding ones of the plurality of interconnections, forming a plurality of external terminals on corresponding ones of the plurality of terminal pads, and cutting the protection layer, the molding layer, and the insulating layer by a singulation process.

According to another aspect, a method of fabricating a semiconductor package may include providing semiconductor chips on a support substrate, the semiconductor chips laterally spaced apart from each other, and each of the semiconductor chips including a chip pad disposed on a bottom surface of each of the semiconductor chips, forming a protection layer covering top surfaces of the semiconductor chips, forming a molding layer covering the support substrate and the protection layer, etching the molding layer formed on the protection layer to expose the protection layer, separating the support substrate from the semiconductor chips, forming an insulating layer on bottom surfaces of the semiconductor chips, forming an interconnection being in contact with the chip pad in the insulating layer, forming a terminal pad on the interconnection, and forming an external terminal on the terminal pad.

In an embodiment, the protection layer may comprise a tape type and may be adhered to the top surfaces of the semiconductor chips.

In an embodiment, first portions of the protection layer may be in contact with the top surfaces of the semiconductor chips.

In an embodiment, second portions of the protection layer may not be in contact with the top surface of the semiconductor chips and may have a thickness greater than that of the first portions of the protection layer with the bottom surface in contact with the top surfaces of the semiconductor chips.

In an embodiment, forming the protection layer may include forming a space between the semiconductor chips, wherein the space is defined by sidewalls of adjacent semiconductor chips, a top surface of the support substrate and a bottom surface of the protection layer.

In an embodiment, forming the molding layer may include forming a molding member and a sacrificial member. The molding member may fill the space on the support substrate, and the sacrificial member may be formed on the protection layer.

In an embodiment, etching the molding layer may include substantially completely removing the sacrificial member while leaving the molding member.

In an embodiment, after forming the external terminal, the method may further include performing a singulation process to separate unit semiconductor packages including the semiconductor chips from each other by cutting the protection layer, the molding member, and the insulating layer.

In an embodiment, etching the molding layer may include substantially completely removing the sacrificial member, and etching an upper portion of the protection layer.

According to another aspect, a method of fabricating a semiconductor package may include providing semiconductor chips spaced apart from each other on a support substrate, forming a protection layer covering top surfaces and upper portions of sidewalls of the semiconductor chips, forming a molding layer between the support substrate and the protection layer and on the protection layer, and removing a portion of the molding layer formed on the protection layer to expose the protection layer and to leave another portion of the molding layer formed between the support substrate and the protection layer. The protection layer disposed on another portion of the molding layer may be thicker than the protection layer disposed on the semiconductor chips.

According to another aspect, a method of fabricating semiconductor packages may comprise providing a plurality of semiconductor chips on a support substrate, the semiconductor chips being spaced apart from each other on the support substrate and the semiconductor chips each comprising a top surface; forming a protection layer covering the top surfaces of the plurality of semiconductor chips and covering a plurality of spaces between two adjacent semiconductor chips, the protection layer comprising a top surface; forming a molding layer covering the top surface of the protection layer, and filling the plurality of spaces; and etching the molding layer formed on the protection layer to expose the protection layer.

In an embodiment, each of the plurality of spaces may be defined by sidewalls of two adjacent semiconductor chips, a bottom surface of the protection layer and a top surface of the support substrate.

In an embodiment, the protection layer may comprise a tape type and forming a protection layer may include disposing the protection layer on the top surfaces of the plurality of semiconductor chips and covering the plurality of spaces.

In an embodiment, forming the molding layer may include forming a molding member and a sacrificial member, wherein the spaces may be filled by the molding member, and the sacrificial member may be formed on the protection layer. The molding layer may be formed by a capillary underfill method or a molded underfill method.

In an embodiment, the method may further comprise providing a plurality connection elements on the support substrate wherein each of the connection elements is spaced apart and adjacent to one of the plurality of semiconductor chips; wherein the protection layer is formed to cover the top surfaces of the plurality of semiconductor chips and top surfaces of the connection elements.

BRIEF DESCRIPTION OF THE DRAWINGS

The embodiments disclosed herein will become more apparent in view of the attached drawings and accompanying detailed description.

FIGS. 4 to 12 are cross-sectional views illustrating a method of fabricating a semiconductor package according to an embodiment disclosed herein.

DETAILED DESCRIPTION OF THE EMBODIMENTS

Figure 1:
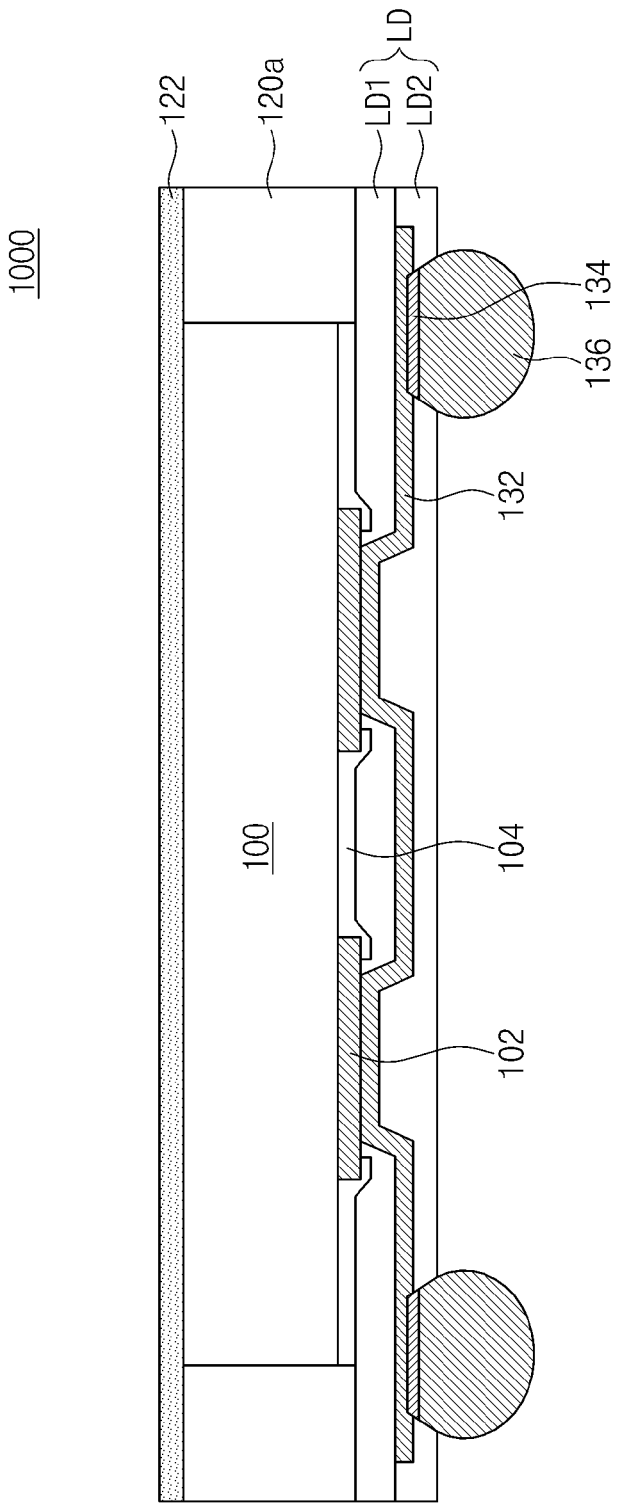
FIG. 1 is a cross-sectional view illustrating a semiconductor package according to an embodiment disclosed herein.

Example embodiments will now be described more fully hereinafter with reference to the accompanying drawings, in which exemplary embodiments are shown. The advantages and features of the example embodiments and methods of achieving the advantages and features will be apparent from the following exemplary embodiments that will be described in more detail with reference to the accompanying drawings. It should be noted, however, that the exemplary embodiments are not limited to the following particular embodiments, and the subject matter disclosed herein may be implemented in various forms. As used herein, the word "exemplary" means "serving as an example, instance, or illustration." Any embodiment described herein as "exemplary" is not to be construed as necessarily preferred or advantageous over other embodiments. Accordingly, the exemplary embodiments are provided only to let those skilled in the art know the category of the claimed subject matter. In the drawings, the exemplary embodiments are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, an embodiment in the detailed description will be described with sectional views as ideal exemplary views of the exemplary embodiments. Accordingly, shapes of the exemplary views may be modified according to manufacturing techniques and/or allowable errors. Therefore, the embodiments disclosed herein are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the claimed subject matter.

It will be also understood that although the terms first, second, third etc., may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein, but are to include deviations in shapes that result, for example, from manufacturing. For example, an etching region illustrated, as a rectangle will, typically, have rounded or curved features. Thus, the regions illustrated in the figures are schematic in nature and their shapes are not intended to illustrate the actual shape of a region of a device and are not intended to limit the scope of claimed subject matter.

FIG. 1 is a cross-sectional view illustrating a semiconductor package according to an embodiment disclosed herein.

Referring to FIG. 1, a semiconductor package 1000 may include a semiconductor chip 100 and a molding member 120a. At least one chip pad 102 and a passivation layer 104 may be disposed on a bottom surface of the semiconductor chip 100. The passivation layer 104 may expose the chip pad 102 and may cover the bottom surface of the semiconductor chip 100.

The molding member 120a may cover sidewalls of the semiconductor chip 100. A top surface of the semiconductor chip 100 may be exposed by the molding member 120a. In some embodiments, top surface of the molding member 120a may be disposed at the same level as a top surface of the semiconductor chip 100. The molding member 120a may include a mixed material of an epoxy-based resin and an inorganic filler, or an epoxy mold compound (EMC)-based material.

A protection layer 122 may be disposed on the semiconductor chip 100. In some embodiments, the protection layer 122 may cover the top surface of the semiconductor chip 100 and the top surface of the molding member 120a. The protection layer 122 may have a width wider than that of the semiconductor chip 100. In some embodiments, a thickness of the protection layer 122 covering the semiconductor chip 100 may be equal or substantially equal to that of the protection layer 122 covering the molding member 120a. The protection layer 122 may be a tape type. The protection layer 122 may include a resin-based material including an epoxy resin, a hardening agent, and/or organic/inorganic fillers and/or may include a polymer such as a resin. For example, the protection layer 122 may include a non-conductive film (NCF), an anisotropic conductive film (ACF), an instant adhesive, a thermosetting adhesive, a laser hardness adhesive, an ultrasonic adhesive, or a non-conductive paste (NCP). In other embodiments, the protection layer 122 may include a laminate or an ultraviolet (UV) film which can be easily removed by UV rays. The protection layer 122 may include a thermal interface material (TIM).

A lower insulating layer LD may be disposed to cover the bottom surfaces of the molding member 120a and the passivation layer 104. In one embodiment, lower insulating layer LD may be disposed to cover the bottom surfaces of the molding member 120a, the passivation layer 104, and a portion of chip pad 102. The lower insulating layer LD may include a first insulating layer LD1 and a second insulating layer LD2. For example, the first insulating layer LD1 may be disposed on and cover the bottom surfaces of the molding member 120a, the passivation layer 104, and a portion of chip pad 102. The second insulating layer LD2 may cover the first insulating layer LD1. A width of the lower insulating layer LD may be equal to that of the protection layer 122. In some embodiments, each of the first and second insulating layers LD1 and LD2 may include an inorganic insulating layer (e.g., a silicon oxide layer, a silicon nitride layer, or a silicon oxynitride layer) or an organic polymer insulating layer (e.g., polyimide). In an embodiment, each of the first and second insulating layers LD1 and LD2 may include photosensitive polyimide.

An interconnection 132 may be disposed between the first insulating layer LD1 and the second insulating layer LD2. The interconnection 132 may penetrate the first insulating layer LD1 so as to be connected to the chip pad 102. Thus, the interconnection 132 may be electrically connected to the semiconductor chip 100 through the chip pad 102.

At least one external terminal 136 may be disposed on a bottom surface of the second insulating layer LD2. A terminal pad 134 may be disposed between the external terminal 136 and the interconnection 132. The terminal pad 134 may be in contact with the interconnection 132 and the external terminal 136, and thus, the external terminal 136 may be electrically connected to the interconnection 132 through the terminal pad 134.

Figure 2:
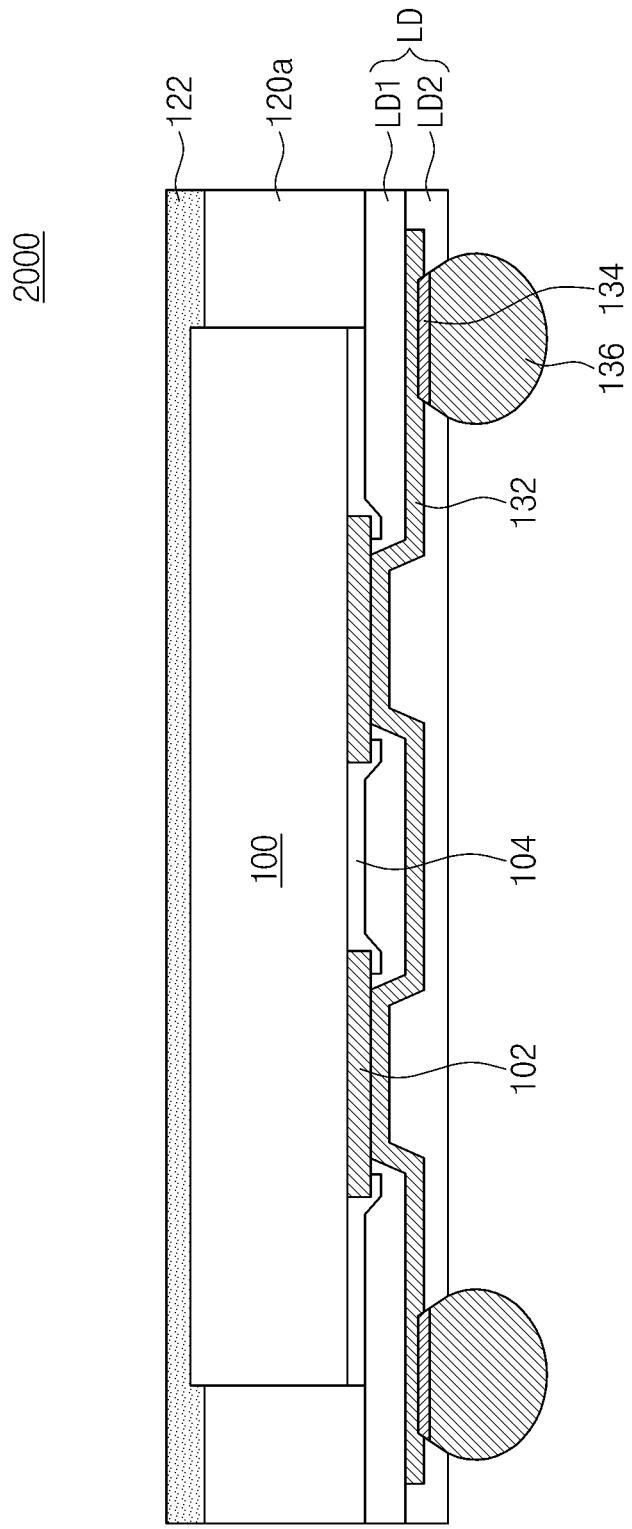
FIG. 2 is a cross-sectional view illustrating a semiconductor package according to an embodiment disclosed herein.

FIG. 2 is a cross-sectional view illustrating a semiconductor package according to an embodiment disclosed herein.

Referring to FIG. 2, a molding member 120a included in a semiconductor package 2000 may be disposed on sidewalls of the semiconductor chip 100. A top surface and upper portions of the sidewalls of the semiconductor chip 100 may be exposed by the molding member 120a. That is, a top surface of the molding member 120a may be disposed at a lower level than a top surface of the semiconductor chip 100.

A protection layer 122 may be disposed on the semiconductor chip 100. The protection layer 122 may cover the top surface of the semiconductor chip 100 and the top surface of the molding member 120a. The protection layer 122 may also cover the upper portions of the sidewalls of the semiconductor chip 100. A thickness of the protection layer 122 covering the semiconductor chip 100 may be different from that of the protection layer 122 covering the molding member 120a. For example, the thickness of the protection layer 122 disposed on the top surface of the semiconductor chip 100 may be less than that of the protection layer 122 disposed on the top surface of the molding member 120a. The protection layer 122 may be a tape type. The protection layer 122 may include a resin-based material including an epoxy resin, a hardening agent, and/or organic/inorganic fillers and/or may include a polymer such as a resin. In some embodiments, the protection layer 122 may include a non-conductive film (NCF), an anisotropic conductive film (ACF), an instant adhesive, a thermosetting adhesive, a laser hardness adhesive, an ultrasonic adhesive, or a non-conductive paste (NCP). In other embodiments, the protection layer 122 may include a laminate or an ultraviolet (UV) film which can be easily removed by UV rays. The protection layer 122 may include a thermal interface material (TIM).

A lower insulating layer LD may be disposed to cover a bottom surface of the molding member 120a and a bottom surface of the passivation layer 104. The lower insulating layer LD may include a first insulating layer LD1 and a second insulating layer LD2. An interconnection 132 may be disposed between the first insulating layer LD1 and the second insulating layer LD2. An external terminal 136 may be disposed on a bottom surface of the second insulating layer LD2. A terminal pad 134 may be disposed between the external terminal 136 and the interconnection 132.

Figure 3:
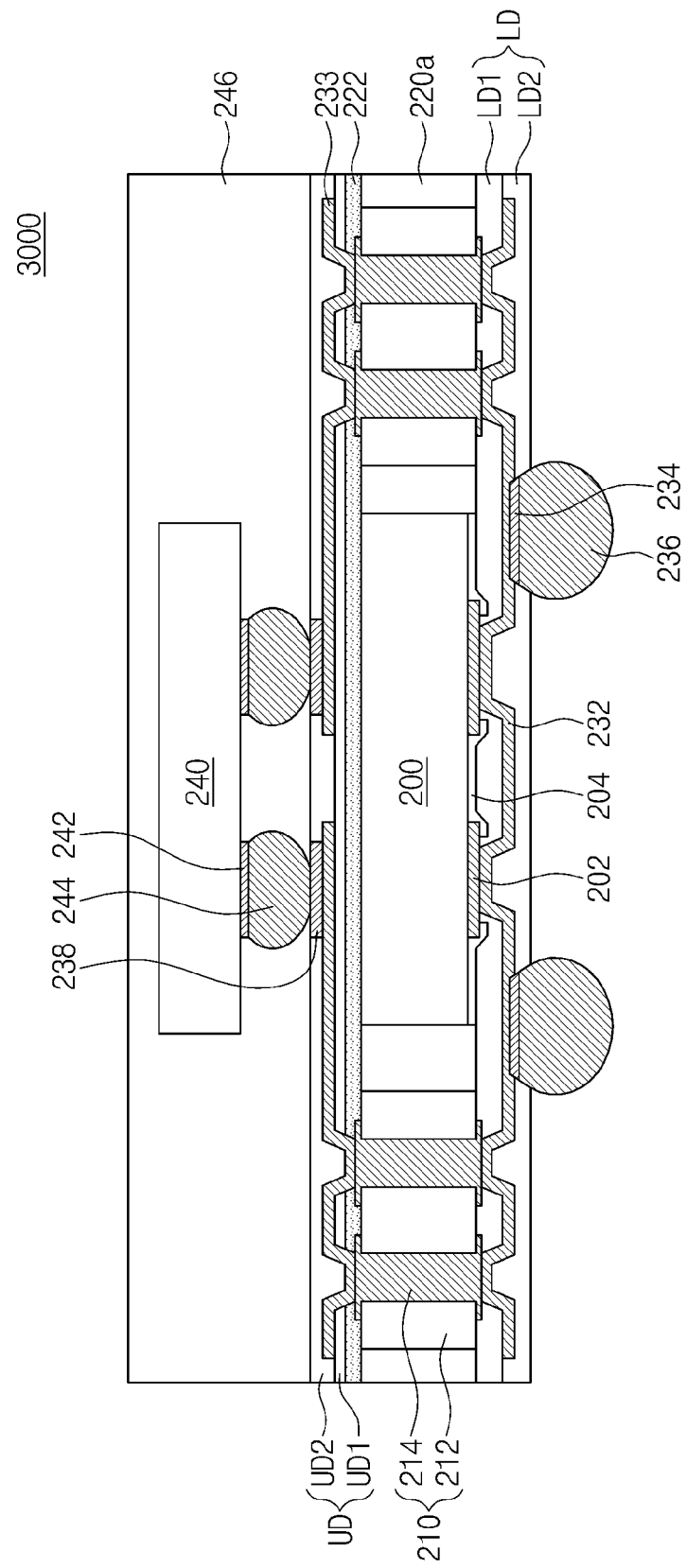
FIG. 3 is a cross-sectional view illustrating a semiconductor package according to an embodiment disclosed herein.

FIG. 3 is a cross-sectional view illustrating a semiconductor package according to an embodiment disclosed herein.

Referring to FIG. 3, a semiconductor package 3000 may include a first semiconductor chip 200, a connecting element 210, a first molding member 220a, and a second semiconductor chip 240. A first chip pad 202 and a passivation layer 204 may be disposed on a bottom surface of the first semiconductor chip 200. In some embodiments, a plurality of the first chip pads 202 may be provided. The passivation layer 204 may expose a second chip pad 202 and may cover the bottom surface of the first semiconductor chip 200.

The connecting element 210 may be disposed at a side of the first semiconductor chip 200 and may be spaced apart from the first semiconductor chip 200. The connecting element 210 may include a body portion 212 and a conductive connection portion 214. The conductive connection portion 214 may penetrate the body portion 212. Two end portions of the conductive connection portion 214 may include a flange or a protrusion to cover a portion of a top surface and a portion of a bottom surface of the body portion 212. A plurality of conductive connection portions 214 may be provided. The plurality of conductive connection portions 214 may be electrically insulated from each other. The body portion 212 may be formed of a copper clad laminate (CCL). A mechanical drilling process may be performed on a CCL to form a cavity, and the cavity may be filled with a conductive material to form the conductive connection portion 214. As a result, the connecting element 210 may be formed.

The first molding member 220a may cover sidewalls of the first semiconductor chip 200 and sidewalls of the connecting element 210. A top surface of the first semiconductor chip 200 may be exposed by the first molding member 220a.

A protection layer 222 may be disposed on the first semiconductor chip 200. In some embodiments, the protection layer 222 may cover a top surface of the first semiconductor chip 200, a top surface of the first molding member 220a, and the top surface of the connecting element 210. A width of the protection layer 222 may be wider than that of the first semiconductor chip 200.

In some embodiments, the protection layer 222 may cover the top surface and upper portions of the sidewalls of the first semiconductor chip 200, like the protection layer 122 illustrated in FIG. 2. A thickness of the protection layer 222 on the first molding member 220a may be greater than that of the protection layer 222 on the first semiconductor chip 200.

The protection layer 222 may be a tape type. In some embodiments, the protection layer 222 may include a resin-based material including an epoxy resin, a hardening agent, and/or organic/inorganic fillers and/or may include a polymer such as a resin. For example, the protection layer 222 may include a non-conductive film (NCF), an anisotropic conductive film (ACF), an instant adhesive, a thermosetting adhesive, a laser hardness adhesive, an ultrasonic adhesive, or a non-conductive paste (NCP). In other embodiments, the protection layer 222 may include a laminate or an ultraviolet (UV) film which can be easily removed by UV rays. The protection layer 222 may include a thermal interface material (TIM).

A lower insulating layer LD may be disposed to cover a bottom surface of the first molding member 220a and a bottom surface of the passivation layer 204. The lower insulating layer LD may include a first insulating layer LD1 and a second insulating layer LD2. For example, the first insulating layer LD1 may be disposed on and cover the bottom surface of the first molding member 220a and the bottom surface of the passivation layer 204. The second insulating layer LD2 may cover the first insulating layer LD1. A width of the lower insulating layer LD may be equal or substantially equal to that of the protection layer 222.

A first interconnection 232 may be disposed between the first insulating layer LD1 and the second insulating layer LD2. The first interconnection 232 may penetrate the first insulating layer LD1 so as to be in contact with the first chip pad 202 and the conductive connection portion 214 exposed at the bottom surface of the body portion 212. Thus, the first interconnection 232 may be electrically connected to the first chip pad 202 and the conductive connection portion 214.

An external terminal 236 may be disposed on a bottom surface of the second insulating layer LD2. The external terminals 236 may be disposed between the first semiconductor chip 200 and the connecting element 210 when viewed from a plan view. A terminal pad 234 may be disposed between the external terminal 236 and the first interconnection 232. The terminal pad 234 may be in contact with the first interconnection 232 and the external terminal 236, and thus, the external terminal 236 may be electrically connected to the first interconnection 232 through the terminal pad 234.

An upper insulating layer UD may be disposed on the protection layer 222. The upper insulating layer UD may include a third insulating layer UD1 and a fourth insulating layer UD2. In detail, the third insulating layer UD1 may cover a top surface of the protection layer 222. The third insulating layer UD1 may be in contact with the top surface of the protection layer 222. The fourth insulating layer UD2 may cover the third insulating layer UD1. In some embodiments, each of the third and fourth insulating layers UD1 and UD2 may include an inorganic insulating layer (e.g., a silicon oxide layer, a silicon nitride layer, or a silicon oxynitride layer) or an organic polymer insulating layer (e.g., polyimide). In an embodiment, each of the third and fourth insulating layers UD1 and UD2 may include photosensitive polyimide.

In some embodiments, the first insulating layer LD1 may be formed of the same layer as the third insulating layer UD1, and the second insulating layer LD2 may be formed of the same layer as the fourth insulating layer UD2.

A second interconnection 233 may be disposed between the third insulating layer UD1 and the fourth insulating layer UD2. The second interconnection 233 may penetrate the third insulating layer UD1 to be in contact with the conductive connection portion 214 exposed at the top surface of the body portion 212. The second interconnection 233 may be connected to one connecting element 210. In some embodiments, if two or more second interconnections 233 and two or more connecting elements 210 are provided, each of the second interconnections 233 may be electrically connected to corresponding one of the connecting elements 210. The second interconnections 233 may be disposed to be spaced apart from each other.

The second semiconductor chip 240 may be mounted on the fourth insulating layer UD2. A second chip pad 242 may be disposed on a bottom surface of the second semiconductor chip 240, and a solder ball 244 may be bonded to the second chip pad 242. The solder ball 244 may be disposed on a top surface of the fourth insulating layer UD2. A connection pad 238 may be disposed between the solder ball 244 and the second interconnection 233. The connection pad 238 may be in contact with the second interconnection 233 and the solder ball 244 to electrically connect the second interconnection 233 to the solder ball 244. A plurality of connection pads 238 may be provided. In some embodiments, each of the connection pads 238 may be in contact with a corresponding one of the second connections 233. In other embodiments, a plurality of the connection pads 238 may be in contact with one second interconnection 233.

A second molding member 246 may be disposed on the upper insulating layer UD. The second molding member 246 may cover the second semiconductor chip 240. Each of the first and second molding members 220a and 246 may include a mixed material of an epoxy-based resin and an inorganic filler, or an epoxy mold compound (EMC)-based material.

FIGS. 4 to 12 are cross-sectional views illustrating a method of fabricating a semiconductor package according to an embodiment disclosed herein.

Referring to FIG. 4, a support substrate 10 may be prepared. The support substrate 10 may include a receiving part 12 and a separation layer 14. The receiving part 12 may be a carrier or an assistant cast disposed on the carrier. For example, the receiving part 12 may be formed of at least one of various materials, such as glass, plastic, or metal. The separation layer 14 may be conformally formed on the receiving part 12. The separation layer 14 may be a double-sided adhesive tape or an adhesive layer. If the separation layer 14 is the double-sided adhesive tape, the separation layer 14 may be adhered to the receiving part 12 by a lamination process using vacuum. If the separation layer 14 is the adhesive layer, an adhesive material may be coated on the receiving part 12 to form the separation layer 14.

Semiconductor chips 100 may be disposed on the separation layer 14. The semiconductor chips 100 may be spaced apart from each other or laterally spaced apart from each other on the separation layer 14. Bottom surfaces of the semiconductor chips 100 may be adhered to the separation layer 14. At least one chip pad 102 and a passivation layer 104 may be disposed on the bottom surface of each of the semiconductor chips 100. The passivation layer 104 may expose the chip pad 102 and may conformally cover the bottom surface of each of the semiconductor chips 100. In other embodiments, the connecting element 210 as illustrated in FIG. 3 may be disposed on the support substrate 10 between the semiconductor chips 100 and adjacent to at least one semiconductor chip.

Referring to FIG. 5, a protection layer 122 may be formed to cover the semiconductor chips 100. In some embodiments, the protection layer 122 may be a tape type, so the protection layer 122 may be adhered to top surfaces of the semiconductor chips 100. In one embodiment, the protection layer 122 may cover top surfaces of at least two semiconductor chips 100 and spaces 121 between the two semiconductor chips. Portions of a bottom surface 124 of the protection layer 122 may be in contact with a top surface of the semiconductor chips. Other portions of the bottom surface 124 of the protection layer 122 may be not in contact with a top surface of the semiconductor chips and spaced apart from a top surface 16 of the substrate support 10. As a result, the space 121 may be formed between adjacent semiconductor chips 100, which may be covered by the bottom surface 124 of the protection layer 122. In other words, the space 121 may be defined by sidewalls 121a and 121b of two adjacent semiconductor chips 100, the top surface 16 of the support substrate 10, and the bottom surface 124 of the protection layer 122.

In some embodiments, the protection layer may include a single piece film that may be disposed on a plurality of semiconductor chips on the support substrate and cover a plurality of spaces between two adjacent semiconductor chips. In another embodiment, the protection layer may include a plurality of pieces and each piece may cover at least two semiconductor chips disposed on the support substrate and a space between the two semiconductor chips. In some embodiments, a thickness of the protection layer may be substantially the uniform.

The protection layer 122 may include a resin-based material including an epoxy resin, a hardening agent, and/or organic/inorganic fillers and/or may include a polymer, such as a resin. In some embodiments, the protection layer 122 may include a non-conductive film (NCF), an anisotropic conductive film (ACF), an instant adhesive, a thermosetting adhesive, a laser hardness adhesive, an ultrasonic adhesive, or a non-conductive paste (NCP). In other embodiments, the protection layer 122 may include a laminate or an ultraviolet (UV) film which can be easily removed by UV rays. The protection layer 122 may include a thermal interface material (TIM).

In other embodiments, portions of the protection layer 122 may also cover upper portions of sidewalls of the semiconductor chips 100, as illustrated in FIG. 2. That is, the portions of the protection layer 122 may be in contact with the upper portions of the sidewalls of the semiconductor chips 100. In other words, portions of the bottom surface of the protection layer are not in contact with the top surfaces of the semiconductor chips and have a thickness that is greater than that of the portions of the protection layer with the bottom surface that are in contact the top surface of the semiconductor chips.

In still other embodiments, the protection layer 122 may also cover the conductive connection portions 214 of the connecting elements 210, like the protection layer 222 illustrated in FIG. 3.

Referring to FIG. 6, a molding layer 120 may be provided on the separation layer 14 to cover the semiconductor chips 100. The molding layer 120 may fill the space 121 and may cover a top surface of the protection layer 122. For example, the molding layer 120 may include a molding member 120a and a sacrificial member 120b. The molding member 120a may fill the space 121 between the semiconductor chips 100 and may cover the sidewalls of the semiconductor chips 100. The sacrificial member 120b may be formed on the protection layer 122 and may cover the top surface of the protection layer 122.

In other embodiments, the molding member 120a may be formed between the connecting element 210 and the semiconductor chip 100, like the first molding member 222a illustrated in FIG. 3.

The molding layer 120 may be formed by a capillary underfill method or a molded underfill (MUF) method. The molding layer 120 may include, for example, a mixed material of an epoxy-based resin and an inorganic filler, or a epoxy mold compound (EMC)-based material.

Referring to FIG. 7, an etching process may be performed on the molding layer 120. The sacrificial member 120b disposed on the protection layer 122 may be substantially completely removed by the etching process, so the protection layer 122 may be exposed. An upper portion of the protection layer 122 may be removed by the etching process, so a lower portion of the protection layer 122 may remain on the semiconductor chips 100 and the molding member 120a. The remaining protection layer 122 may have a predetermined thickness. The etching process may be an etch-back process or a polishing process. The polishing process may be a chemical mechanical polishing (CMP) process. Alternatively, the protection layer 122 may not be etched when the sacrificial member 120b is removed.

In other embodiments, a thickness of the protection layer 122 disposed on the semiconductor chip 100 may be different from that of the protection layer 122 disposed on the molding member 120a. For example, a thickness of the protection layer 122 disposed on the molding member 120a may be greater than that of the protection layer 122 disposed on the semiconductor chip 100 as illustrated in FIG. 2.

To form a semiconductor package having a similar thickness to a semiconductor chip, a molding layer covering the semiconductor chip may be thinned by an etching process. For example, the molding layer may be etched by a polishing process. In this process, residues and/or slurry particles occurring during the polishing process may damage a top surface of the semiconductor chip. In other words, defects (e.g., a scratch and/or a fine crack) may occur on the semiconductor chips, so reliability and a yield of semiconductor packages may be reduced.

According to embodiments of the inventive concepts, the protection layer 122 may be formed on the semiconductor chips 100 before the formation of the molding layer 120 covering the semiconductor chips 100. Thus, the top surfaces of the semiconductor chips 100 may be protected by the protection layer 122 during the etching process (e.g., the polishing process) performed on the molding layer 120. The protection layer 122 may prevent the semiconductor chips from being damaged by slurry particles and/or etch residues and may protect the semiconductor chips 100 from damage which may be caused by external environment during subsequent processes. In addition, the protection layer 122 may minimize or prevent a warpage phenomenon of the support substrate 10. The warpage phenomenon of the support substrate 10 may be caused by the very thin the semiconductor chips 100 even though the molding layer 120 is formed on the semiconductor chips 100.

Figure 8:
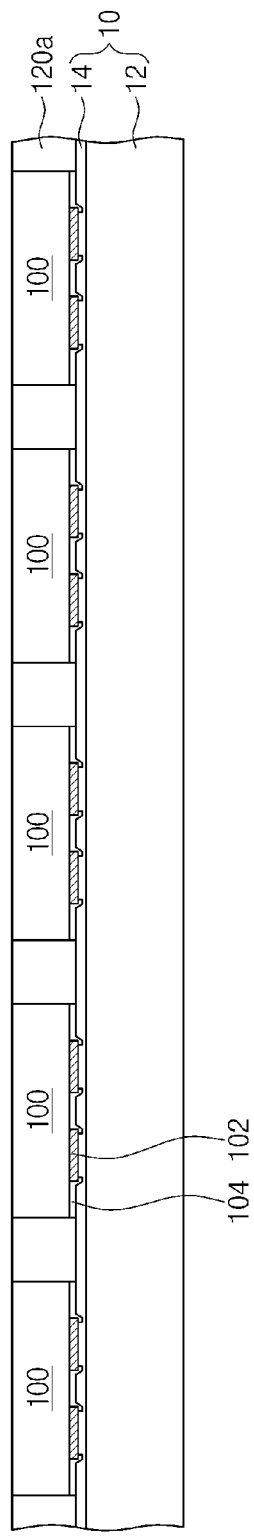

In other embodiments, the protection layer 122 remaining after the etching process may be selectively removed, as illustrated in FIG. 8. The protection layer 122 may be removed using any one of a UV irradiation method, a physical method, or a chemical method. The protection layer 122 may be removed to expose the top surface of the molding member 120a and the top surfaces of the semiconductor chips 100.

Figure 9:
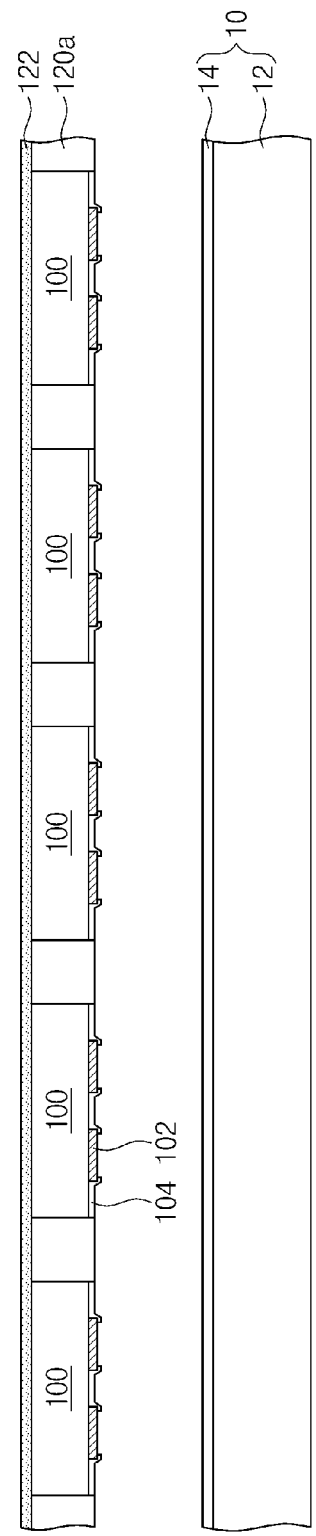

Referring to FIG. 9, the separation layer 14 may be selectively removed to separate the support substrate 10 from the semiconductor chips 100. If the separation layer 14 is the double-sided adhesive tape, heat of, for example, 170 degrees Celsius or more may be applied to weaken adhesive force of the double-sided adhesive tape. Thus, the separation layer 14 may be separated. If the receiving part 12 is formed of the glass, UV rays may be irradiated to the separation layer 14 through a back side of the receiving part 12. Thus, the adhesive strength of the separation layer 14 may be weakened, so the separation layer 14 may be separated from the semiconductor chips 100. In still another embodiment, the separation layer 14 may be dissolved by a chemical, so the separation layer 14 may be removed. As a result, the chip pad 102 and the bottom surface of the molding member 120a may be exposed.

Figure 10:
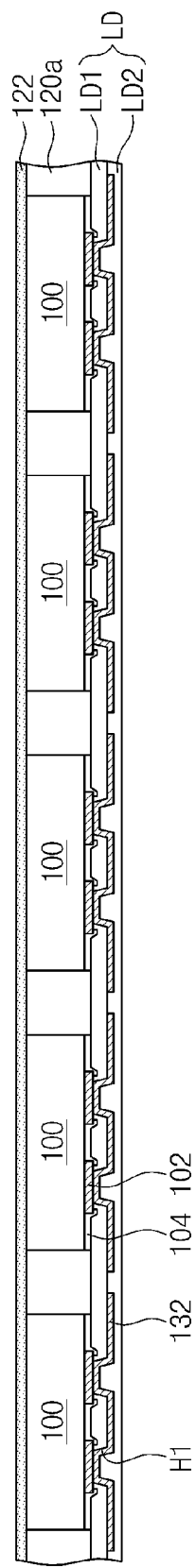

Referring to FIG. 10, a first insulating layer LD1 may be formed on the bottom surface of the molding member 120a. The first insulating layer LD1 may be in contact with the chip pad 102. The first insulating layer LD1 may be formed by performing, for example, a spin-coating method, a physical vapor deposition (PVD) method, a chemical vapor deposition (CVD) method, a sputtering method, an atomic layer deposition (ALD) method, or a printing method. In some embodiments, the first insulating layer LD1 may be formed of an inorganic insulating layer (e.g., a silicon oxide layer, a silicon nitride layer, or a silicon oxynitride layer) or an organic polymer insulating layer (e.g., polyimide). In an embodiment, the first insulating layer LD1 may include photosensitive polyimide.

The first insulating layer LD1 may be patterned to form a first via-hole H1. The chip pad 102 may be exposed through the first via-hole H1. The first via-hole H1 may be formed using, for example, a laser process, a photolithography process, and/or an etching process.

An interconnection 132 may be formed on the first insulating layer LD1. In some embodiments, an interconnection layer (not shown) may be formed on the first insulating layer LD1, and the interconnection layer may be patterned to form the interconnection 132. The interconnection 132 may cover a portion of a surface of the first insulating layer LD1 and may be in contact with the chip pad 102. The interconnection 132 may include a conductive material (e.g., copper (Cu)). The interconnection 132 may be electrically connected to the semiconductor chip 100. In other embodiments, the interconnection 132 may also be connected to the conductive connection portion 214 of the connecting element 210, like the first interconnection 232 illustrated in FIG. 3.

A second insulating layer LD2 may be formed on the first insulating layer LD1. The second insulating layer LD2 may cover the interconnection 132. The second insulating layer LD2 may be formed by performing, for example, a spin-coating method, a PVD method, a CVD method, a sputtering method, an ALD method, or a printing method. In some embodiments, the second insulating layer LD2 may be formed of an inorganic insulating layer (e.g., a silicon oxide layer, a silicon nitride layer, or a silicon oxynitride layer) or an organic polymer insulating layer (e.g., polyimide). In an embodiment, the second insulating layer LD2 may include photosensitive polyimide.

The first and second insulating layers LD1 and LD2 may constitute a lower insulating layer LD.

Figure 11:
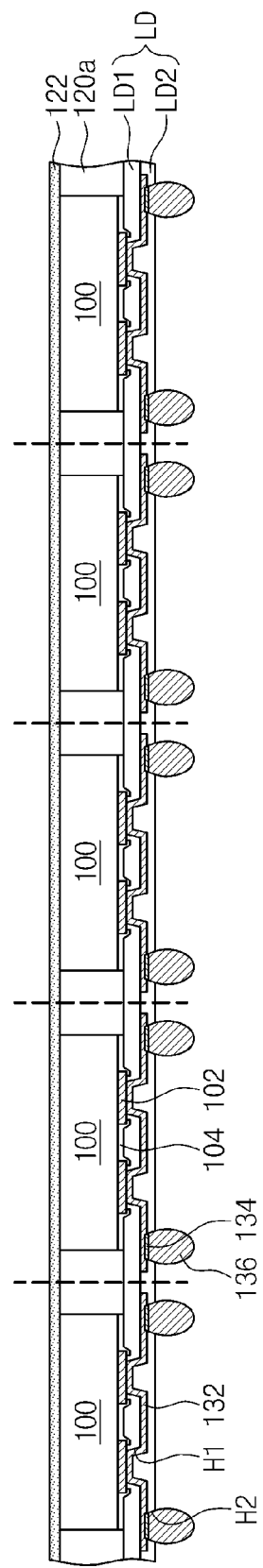
Figure 12:
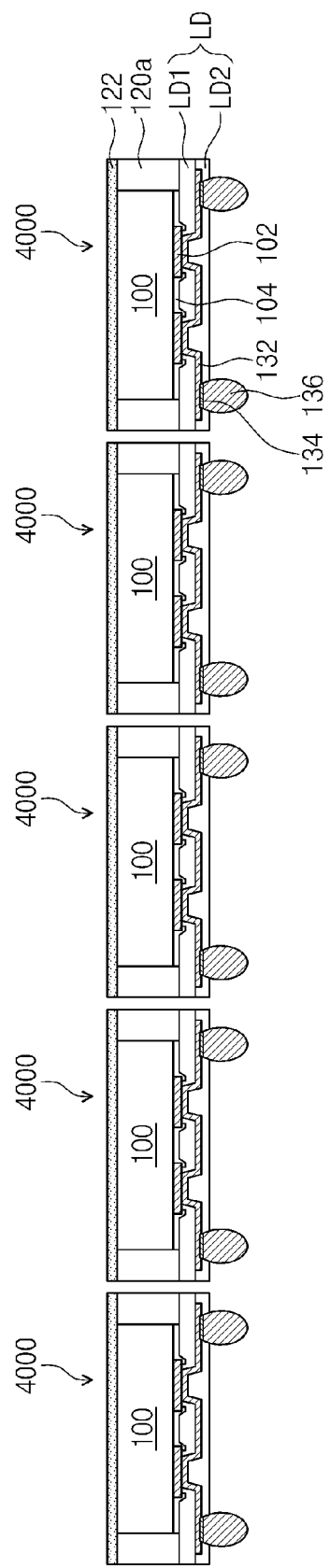

Referring to FIGS. 11 and 12, the second insulating layer LD2 may be patterned to form a second via-hole H2 exposing the interconnection 132, and a terminal pad 134 may be formed on the interconnection 132 exposed through the second via-hole H2. The second via-hole H2 may be formed using, for example, a laser process, a photolithography process, and/or an etching process. The terminal pad 134 may be in electrical contact with the interconnection 132. An external terminal 136 may be formed on the terminal pad 134.

A singulation process may be performed to cut the protection layer 122, the molding member 120a, and the lower insulating layer LD along dotted lines illustrated in FIG. 11. Thus, unit semiconductor packages 4000 may be separated from each other. The unit semiconductor packages 400 may include the semiconductor chips 100, respectively. In some embodiment, each of the unit semiconductor packages 4000 may correspond to the semiconductor package 1000 or 2000 illustrated in FIG. 1 or 2. In other embodiments, each of the unit semiconductor packages 4000 may correspond to the semiconductor package including the connecting element 210 illustrated in FIG. 3. In still other embodiments, if the protection layer 122 does not exists on the molding member 120a as illustrated in FIG. 8, an additional protection layer may be formed on the semiconductor chips 100 and the molding member 120a before the singulation process. The additional protection layer may include the same material as the protection layer 122.

The semiconductor package may be a fan-out wafer-level package.

Figure 13:
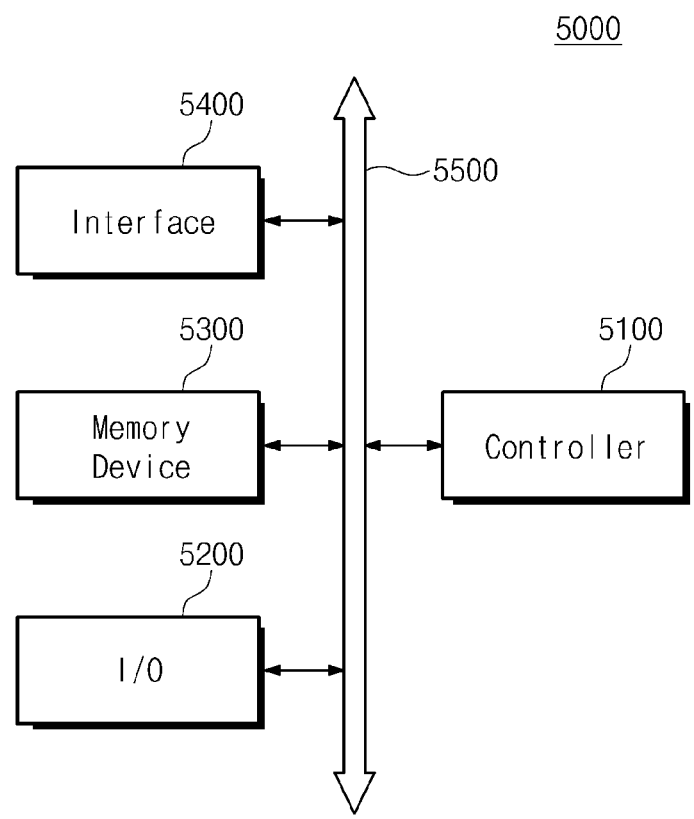
FIG. 13 is a schematic block diagram illustrating an embodiment of an electronic system including a semiconductor package according to an embodiment disclosed herein.
Figure 14:
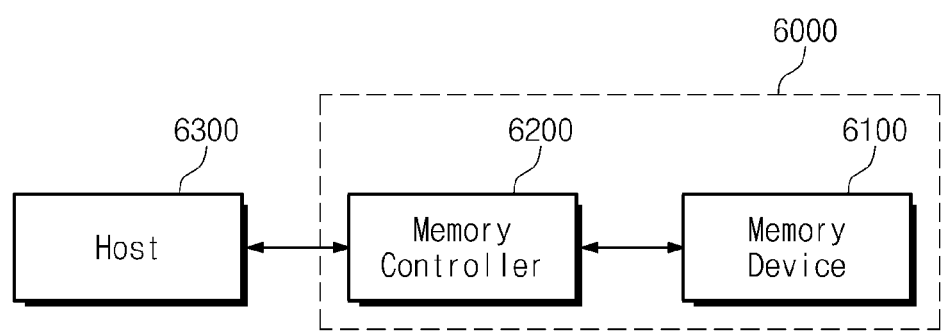
FIG. 14 is a schematic block diagram illustrating an embodiment of a memory system including a semiconductor package according to an embodiment disclosed herein.

FIG. 13 is a schematic block diagram illustrating an embodiment of an electronic system including a semiconductor package according to an embodiment of the inventive concepts. FIG. 14 is a schematic block diagram illustrating an embodiment of a memory system including a semiconductor package according to an embodiment of the inventive concepts.

Referring to FIG. 13, an electronic system 5000 may include a controller 5100, an input/output (I/O) unit 5200, and a memory device 5300. The controller 5100, the I/O unit 5200, and the memory device 5300 may communicate with each other through a data bus 5500. The data bus 5500 may correspond to a path through which electrical signals are transmitted. For example, the controller 5100 may include at least one of a microprocessor, a digital signal processor, a microcontroller, or other logic devices having the similar function as any one thereof. At least one of the controller 5100 and the memory device 5300 may include at least one of the semiconductor packages according to the aforementioned embodiments of the inventive concepts. The I/O unit 5200 may include a keypad, a keyboard and/or a display device. The memory device 5300 may store data and/or commands executed by the controller 5100. The memory device 5300 may include a volatile memory device and/or a non-volatile memory device. In an embodiment, the memory device 5300 may include a flash memory device. The flash memory device may be realized as a solid state disk (SSD). In this case, the electronic system 5000 may stably store massive data in the flash memory device. The electronic system 5000 may further include an interface unit 5400 that transmits electrical data to a communication network or receives electrical data from a communication network. The interface unit 5400 may operate by wireless or cable. For example, the interface unit 5400 may include an antenna or a cable/wireless transceiver. Although not shown in the drawings, the electronic system 5000 may further include an application chipset or a camera image processor (CIS).

The electronic system 5000 may be realized as a mobile system, a personal computer, an industrial computer, or a logic system performing various functions. For example, the mobile system may be a personal digital assistant (PDA), a portable computer, a web tablet, a mobile phone, a wireless phone, a laptop computer, a memory card, a digital music player, or an information transmitting/receiving system. If the electronic system 5000 perform wireless communication, the electronic system 5000 may be used to realize a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

Referring to FIG. 14, a memory system 6000 may include a non-volatile memory device 6100 and a memory controller 6200. The non-volatile memory device 6100 and the memory controller 6200 may store data or sense stored data. The non-volatile memory device 6100 may include at least one of the semiconductor packages according to the above mentioned embodiments of the inventive concepts. The memory controller 6200 may control the non-volatile memory device 6100 in response to sensing/writing requests of a host 6300 to sense the stored data and/or to store data.

According to embodiments of the inventive concepts, the protection layer may be formed on the semiconductor chip before the formation of the molding layer. Since the protection layer is the tape type, the protection layer may be selectively removed after the polishing process of the molding layer. As a result, the protection layer may protect the semiconductor chip during the polishing process of the molding layer and may be easily removed without damage of the surface of the semiconductor chip.

While the exemplary embodiments have been described, it will be apparent to those skilled in the art that various changes and modifications may be made without departing from the scope of the claimed subject matter. Therefore, it should be understood that the above embodiments are not limiting, but illustrative. Thus, the scope of the claimed subject matter is to be determined by the broadest permissible interpretation of the following claims and their equivalents, and shall not be restricted or limited by the foregoing description.

What is claimed is:

1. A method of fabricating a semiconductor package, the method comprising:
providing a plurality of semiconductor chips on a support substrate, the semiconductor chips spaced apart from each other on the support substrate;
forming a protection layer covering top surfaces of the plurality of semiconductor chips;
forming a molding layer covering the support substrate and the protection layer; and
etching the molding layer formed on the protection layer to expose the protection layer,
wherein a thickness of the protection layer is reduced after etching the molding layer formed on the protection layer.

2. The method of claim 1, wherein first portions of a bottom surface of the protection layer are in contact with the top surfaces of the plurality of semiconductor chips.

3. The method of claim 2, wherein second portions of the bottom surface of the protection layer are not in contact with the top surfaces of the plurality of semiconductor chips and have a thickness greater than that of the first portions of the protection layer with the bottom surface in contact the top surfaces of the plurality of the semiconductor chips.

4. The method of claim 2, wherein second portions of the bottom surface of the protection layer are not in contact with the top surfaces of the plurality of semiconductor chips and are spaced apart from a top surface of the support substrate.

5. The method of claim 1, wherein forming the protection layer comprises:
forming a plurality of spaces between the semiconductor chips, wherein the spaces are defined by sidewalls of adjacent semiconductor chips, a top surface of the support substrate and a bottom surface of the protection layer.

6. The method of claim 5, wherein forming the molding layer comprises:
forming a molding member and a sacrificial member, wherein the spaces are filled by the molding member, and the sacrificial member is formed on the protection layer.

7. The method of claim 6, wherein etching the molding layer comprises:
substantially completely removing the sacrificial member while leaving the molding member.

8. The method of claim 6, wherein etching the molding layer comprises:
substantially completely removing the sacrificial member; and
etching an upper portion of the protection layer.

9. The method of claim 1, wherein the protection layer comprises a tape type and is adhered to the top surfaces of the plurality of semiconductor chips.

10. The method of claim 1, further comprising:
separating the support substrate from the plurality of semiconductor chips;
forming an insulating layer on bottom surfaces of the plurality of semiconductor chips;
forming a plurality of interconnections in the insulating layer, each interconnection electrically connected to a corresponding one of the plurality of semiconductor chips;
forming a plurality of terminal pads on corresponding ones of the plurality of interconnections;
forming a plurality of external terminals on corresponding ones of the plurality of terminal pads; and
cutting the protection layer, the molding layer, and the insulating layer to separate each semiconductor chip package including a semiconductor chip by a singulation process.

11. A method of fabricating semiconductor packages, the method comprising:
providing semiconductor chips on a support substrate, the semiconductor chips laterally spaced apart from each other, and each of the semiconductor chips including a chip pad disposed on a bottom surface;
forming a protection layer covering top surfaces of the semiconductor chips;
forming a molding layer covering the support substrate and the protection layer;
etching the molding layer formed on the protection layer to expose the protection layer;
separating the support substrate from the semiconductor chips;
forming an insulating layer on bottom surfaces of the semiconductor chips;
forming an interconnection being in contact with the chip pad in the insulating layer;
forming a terminal pad on the interconnection; and
forming an external terminal on the terminal pad,
wherein a thickness of the protection layer is reduced after etching the molding layer formed on the protection layer.

12. The method of claim 11, wherein the protection layer comprises a tape type and is adhered to the top surfaces of the semiconductor chips.

13. The method of claim 11, wherein first portions of the protection layer are in contact with the top surfaces of the semiconductor chips.

14. The method of claim 13, wherein second portions of the protection layer are not in contact with the top surfaces of the semiconductor chips and have a thickness greater than that of the first portions of the protection layer with the bottom surface in contact with the top surfaces of the semiconductor chips.

15. The method of claim 11, wherein forming the protection layer comprises:
forming a space between the semiconductor chips, wherein the space is defined by sidewalls of adjacent semiconductor chips, a top surface of the support substrate and a bottom surface of the protection layer.

16. A method of fabricating semiconductor packages, the method comprising:
providing a plurality of semiconductor chips on a support substrate, the semiconductor chips being spaced apart from each other on the support substrate, and each semiconductor chip comprising a top surface;
forming a protection layer covering the top surfaces of the plurality of semiconductor chips and covering a plurality of spaces between two adjacent semiconductor chips, the protection layer comprising a top surface;
forming a molding layer covering the top surface of the protection layer, and filling the plurality of spaces; and
etching the molding layer formed on the protection layer to expose the protection layer,
wherein a thickness of the protection layer is reduced after etching the molding layer formed on the protection layer.

17. The method of claim 16, wherein each of the plurality of spaces is defined by sidewalls of two adjacent semiconductor chips, a bottom surface of the protection layer and a top surface of the support substrate.

18. The method of claim 17, wherein the protection layer comprises a tape type and wherein forming a protection layer includes disposing the protection layer on the top surfaces of the plurality of semiconductor chips and covering the plurality of spaces.

19. The method of claim 17, wherein forming the molding layer comprises forming a molding member and a sacrificial member, wherein the spaces are filled by the molding member, wherein the sacrificial member is formed on the protection layer, and wherein the molding layer is formed by a capillary underfill method or a molded underfill method.

20. The method of claim 16, further comprising:
providing a plurality of connecting elements on a same side of the support substrate as the plurality of semiconductor chips, wherein each of the connecting elements is spaced apart and adjacent to one of the plurality of semiconductor chips; wherein the protection layer is formed to cover the top surfaces of the plurality of semiconductor chips and top surfaces of the connecting elements.

* * * * *